US012764877B2

(12) United States Patent
Ogawa et al.

(10) Patent No.: US 12,764,877 B2
(45) Date of Patent: Oct. 13, 2026

(54) FRAME SYSTEM AND DISPLAY DEVICE

(71) Applicant: SONY GROUP CORPORATION, Tokyo (JP)

(72) Inventors: Shigeyuki Ogawa, Tokyo (JP); Yutaka Nomura, Tokyo (JP); Mitsuo Ogawa, Tokyo (JP); Tomoya Miura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 233 days.

(21) Appl. No.: 18/716,822

(22) PCT Filed: Dec. 5, 2022

(86) PCT No.: PCT/JP2022/044776
§ 371 (c)(1),
(2) Date: Jun. 5, 2024

(87) PCT Pub. No.: WO2023/112755
PCT Pub. Date: Jun. 22, 2023

(65) Prior Publication Data

US 2025/0040066 A1 Jan. 30, 2025

(30) Foreign Application Priority Data

Dec. 13, 2021 (JP) ................................ 2021-201685

(51) Int. Cl.
*H05K 5/02* (2006.01)
*H05K 5/30* (2025.01)

(52) U.S. Cl.
CPC ............ *H05K 5/0217* (2013.01); *H05K 5/30* (2025.01)

(58) Field of Classification Search
CPC ....... H05K 5/0017; H05K 5/0217; H05K 5/30
(Continued)

(56) References Cited

U.S. PATENT DOCUMENTS 5,904,328 A * 5/1999 Leveridge .............. F16M 11/10 248/922
2009/0309494 A1 12/2009 Patterson et al.
(Continued)

FOREIGN PATENT DOCUMENTS

CN 204533998 U 8/2015
CN 210836929 U 6/2020
(Continued)

OTHER PUBLICATIONS

International Search Report and Written Opinion of PCT Application No. PCT/JP2022/044776, issued on Jan. 24, 2023, 10 pages of ISRWO.

*Primary Examiner* — Hung S. Bui
(74) *Attorney, Agent, or Firm* — CHIP LAW GROUP

(57) ABSTRACT

A frame system (3) according to the present disclosure includes a plurality of back frames (4) and a plurality of base frames (5). The plurality of back frames (4) is arranged side by side, and can respectively holds back surfaces of display units (2). The plurality of base frames (5) couples the back frames (4), which are adjacent to each other, in a direction parallel to a floor (F). In addition, each of the back frames (4) and a pair of the base frames (5) coupled to the back frame (4) include an angle adjustment unit (20) that adjusts an angle between the pair of base frames (5).

20 Claims, 8 Drawing Sheets

(58) Field of Classification Search
USPC .......................................... 361/807, 809, 810
See application file for complete search history.

(56) References Cited

U.S. PATENT DOCUMENTS

| | | | |
|---|---|---|---|
| 2013/0148324 | A1 | 6/2013 | Szolyga et al. |
| 2020/0357311 | A1 | 11/2020 | Yoon et al. |

FOREIGN PATENT DOCUMENTS

| | | | | | |
|---|---|---|---|---|---|
| CN | 211820360 | U | | 10/2020 | |
| CN | 212322573 | U | | 1/2021 | |
| CN | 212933998 | U | | 4/2021 | |
| CN | 213211582 | U | | 5/2021 | |
| JP | 2013-533981 | A | | 8/2013 | |
| JP | 2016-218201 | A | | 12/2016 | |
| KR | 101969903 | B1 | * | 4/2019 | ........... G06F 1/1637 |

* cited by examiner

FRAME SYSTEM AND DISPLAY DEVICE

CROSS REFERENCE TO RELATED APPLICATIONS

This application is a U.S. National Phase of International Patent Application No. PCT/JP2022/044776 filed on Dec. 5, 2022, which claims priority benefit of Japanese Patent Application No. JP 2021-201685 filed in the Japan Patent Office on Dec. 13, 2021. Each of the above-referenced applications is hereby incorporated herein by reference in its entirety.

FIELD

The present disclosure relates to a frame system and a display device.

BACKGROUND

Conventionally, a large-screen display device (hereinafter, also referred to as a video wall) that forms one display screen by an arrangement of a plurality of display units in a matrix has been known. Such a video wall is configured by, for example, an arrangement and assembly of a plurality of display units in a frame (see, for example, Patent Literature 1.).

CITATION LIST

Patent Literature

Patent Literature 1: Japanese Patent Application Laid-open No. 2016-218201

SUMMARY

Technical Problem

The present disclosure proposes a frame system and a display device capable of easily forming a large screen having a desired curvature.

Solution to Problem

According to the present disclosure, there is provided a frame system. The frame system includes a plurality of back frames and a plurality of base frames. The plurality of back frames is arranged side by side, and can respectively holds back surfaces of display units. The plurality of base frames couples the back frames, which are adjacent to each other, in a direction parallel to a floor. In addition, each of the back frames and a pair of the base frames coupled to the back frame include an angle adjustment unit that adjusts an angle between the pair of base frames.

DESCRIPTION OF EMBODIMENTS

Hereinafter, embodiments of the present disclosure will be described with reference to the accompanying drawings. Note that the present disclosure is not limited to the following embodiments. In addition, the embodiments can be arbitrarily combined in a range in which the processing contents do not contradict each other. Also, in the following embodiments, the same reference sign is assigned to the same parts and an overlapped description thereof is omitted.

Although expressions such as “constant”, “orthogonal”, “vertical”, or “parallel” may be used in the embodiments described below, these expressions do not need to be strictly “constant”, “orthogonal”, “vertical”, or “parallel”. That is, it is assumed that each of the expressions described above allows deviation in manufacturing accuracy, installation accuracy, and the like, for example.

Conventionally, a large-screen display device (hereinafter, also referred to as a video wall) that forms one display screen by an arrangement of a plurality of display units in a matrix has been known.

Such a video wall is used, for example, for an advertisement display in a town, an exhibition, and information provision to spectators in a sports facility or the like. In addition, the video wall is configured by, for example, an arrangement and assembly of a plurality of display units in a frame.

On the other hand, in the above-described related art, while a video wall having a flat screen can be assembled relatively easily, it is very difficult to accurately assemble a screen having a desired curvature.

Thus, it is expected to realize a technology capable of overcoming the above-described problems and easily forming a large screen having a desired curvature in a video wall.

[Display System]

Figure 1:
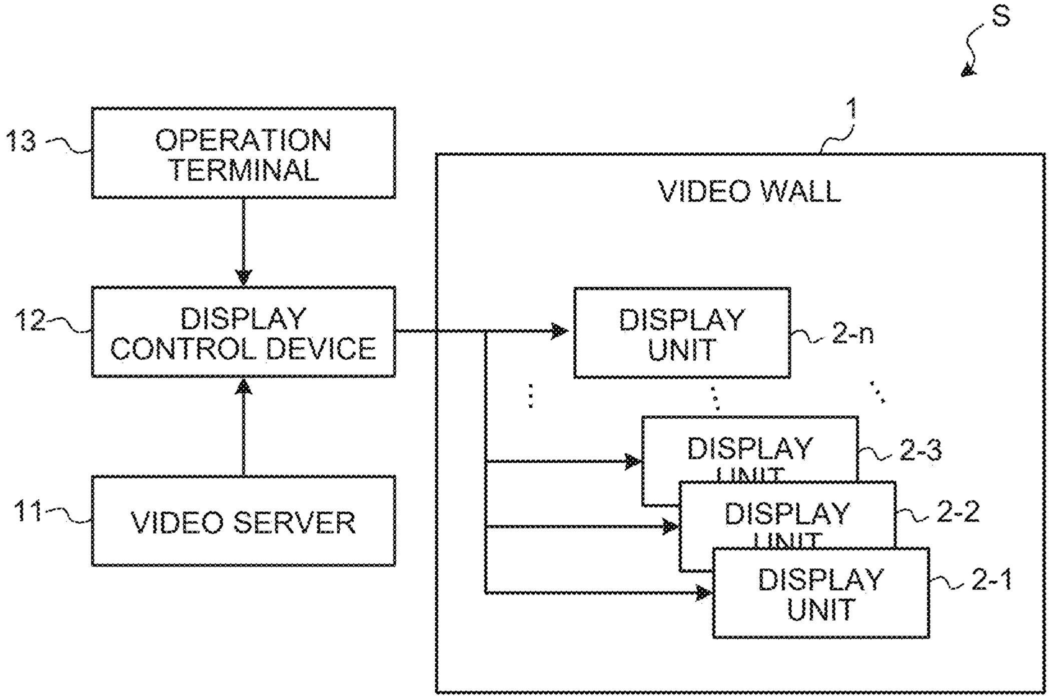
FIG. 1 is a block diagram illustrating an example of a configuration of a display system according to an embodiment of the present disclosure.

First, a configuration of a display system S according to the embodiment will be described with reference to FIG. 1. FIG. 1 is a block diagram illustrating an example of the configuration of the display system S according to the embodiment of the present disclosure.

As illustrated in FIG. 1, the display system S according to the embodiment includes a video wall 1, a video server 11, a display control device 12, and an operation terminal 13. The video wall 1 according to the embodiment is an example of a display device, and is also referred to as multiple displays, a tiling display, or the like.

The video wall 1 according to the embodiment includes a plurality of display units 2-1 to 2-*n*. Details of the video wall 1 will be described later.

The video server 11 stores various kinds of video data. Note that the video data stored in the video server 11 may be a moving image or a still image.

The display control device 12 divides the video data acquired from the video server 11 and performs distribution thereof to the plurality of display units 2-1 to 2-*n* provided on the video wall 1. Pieces of divided video based on the divided video data are respectively displayed on the plurality of display units 2-1 to 2-*n*.

Then, the whole video based on the video data is formed on the video wall 1 by a set of the pieces of divided video respectively displayed on the plurality of display units 2-1 to 2-*n*.

The operation terminal 13 is, for example, a personal computer (PC), and operates the display control device 12. The operation terminal 13 designates, for example, video data acquired by the display control device 12 from the video server 11 and displayed on the video wall 1.

Note that the video data transmitted from the operation terminal 13 to the display control device 12 may be displayed on the video wall 1 in the present disclosure.

[Video Wall]

Figure 2:
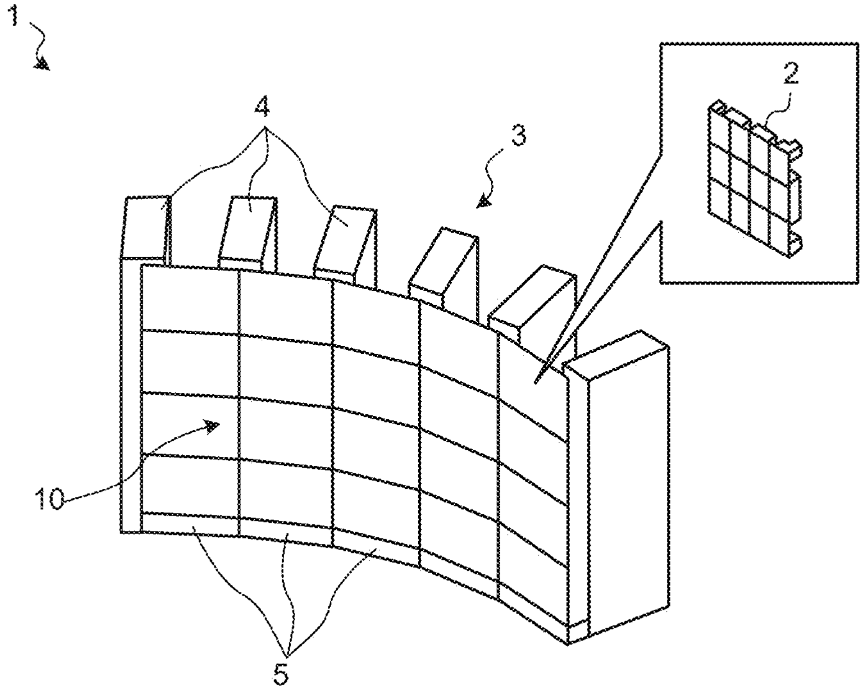
FIG. 2 is a perspective view illustrating an example of an outline of a video wall according to the embodiment of the present disclosure.

Next, an outline of the video wall 1 according to the embodiment will be described with reference to FIG. 2. FIG. 2 is a perspective view illustrating an example of an outline of the video wall 1 according to the embodiment of the present disclosure.

As illustrated in FIG. 2, the video wall 1 includes a plurality of display units 2 and a frame system 3. Each of the display units 2 is a unit (module) including a display panel on which a video is displayed by electric control.

The display unit 2 includes a display panel including a pixel array unit, and a circuit unit provided with a circuit to drive the pixel array unit, a power supply, and the like. Note that the configuration illustrated in FIG. 2 is an example, and the number, a shape, an arrangement, and the like of the display units 2 are not limited thereto.

In the pixel array unit included in the display panel of the display unit 2, for example, a plurality of pixels is arranged in a matrix. In one pixel, for example, light emitting elements that emit light of three primary colors of red (R), green (G), and blue (B) is arranged. Examples of such light emitting elements include light emitting diodes (LED).

The display panel is, for example, a glass epoxy substrate on which an LED is mounted. In this pixel array unit, each pixel is pulse-driven on the basis of a video signal input from the display control device 12 (see FIG. 2), whereby luminance of each LED is adjusted and a video is displayed. Note that the display panel of the display unit 2 may be a liquid crystal panel, an organic electro-luminescence (EL) panel, or the like.

The video wall 1 according to the embodiment includes a display unit group 10 in which a plurality of the display units 2 is arranged in a matrix and which included in one display screen. The frame system 3 is a structure that supports the plurality of display units 2 (that is, the display unit group 10).

[Frame System]

Figure 3:
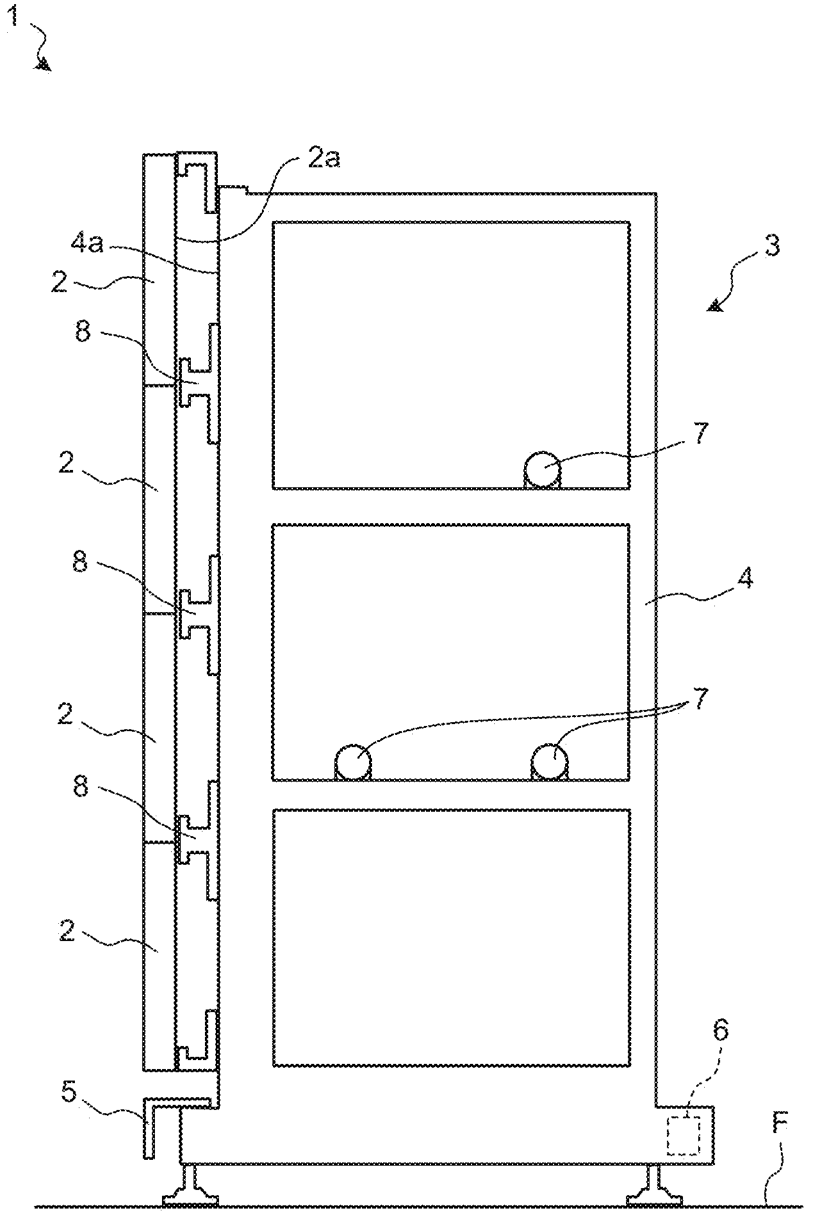
FIG. 3 is a side view illustrating an example of a configuration of the video wall according to the embodiment of the present disclosure.

Next, details of the frame system 3 according to the embodiment will be described with reference to FIG. 3 to FIG. 14 in addition to FIG. 2 described above. FIG. 3 is a side view illustrating an example of a configuration of the video wall 1 according to the embodiment of the present disclosure, and FIG. 4 is an enlarged top view illustrating an example of a configuration of the frame system 3 according to the embodiment of the present disclosure.

Figure 4:
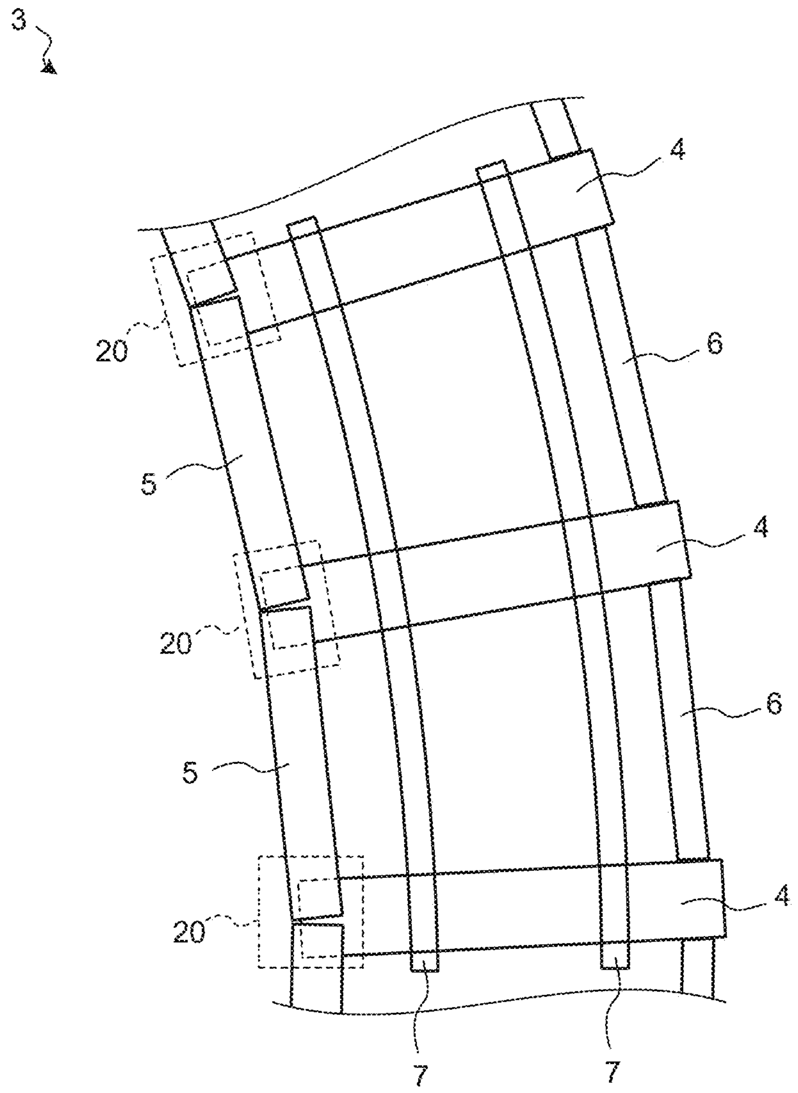
FIG. 4 is an enlarged top view illustrating an example of a configuration of a frame system according to the embodiment of the present disclosure.

Note that although a plurality of attachment members 8 (see FIG. 3) and the plurality of display units 2 (see FIG. 3) are not illustrated in FIG. 4 to make understanding easier, these members are arranged on a left side of FIG. 4.

As illustrated in FIG. 2 to FIG. 4, the frame system 3 includes a plurality of back frames 4, a plurality of base frames 5, a plurality of first coupling members 6, a plurality of second coupling members 7, and a plurality of attachment members 8.

As illustrated in FIG. 3, each of the back frames 4 is arranged on a floor F in a state of rising vertically to the floor F. In addition, as illustrated in FIG. 2 and the like, the plurality of back frames 4 is arranged in a line.

Furthermore, as illustrated in FIG. 3, side portions 4*a* of the back frames 4 directed in the same direction can hold peripheral edge portions of the back surfaces 2*a* (that is, opposite surface of a display surface) of the display units 2 via the attachment members 8. In addition, the plurality of attachment members 8 is provided on the side portion 4*a* of one back frame 4.

As illustrated in FIG. 2, the base frames 5 couples the back frames 4, which are adjacent to each other, in a direction parallel to the floor F (see FIG. 3). In addition, as illustrated in FIG. 3, the base frames 5 are arranged at bottom portions on a side of holding the display units 2 (that is, the side portions 4*a*) in the back frames 4.

As illustrated in FIG. 4, the first coupling members 6 couple the adjacent back frames 4 in the direction parallel to the floor F (see FIG. 3). In addition, as illustrated in FIG. 3, the first coupling members 6 are arranged at bottom portions on a side opposite to the side of holding the display units 2 in the back frames 4.

Furthermore, the second coupling members 7 also couple the adjacent back frames 4 in the direction parallel to the floor F. The second coupling members 7 are arranged between the base frames 5 and the first coupling members 6 in a planar view as illustrated in FIG. 4, and are arranged at positions farther from the floor F than the first coupling members 6 (that is, positions higher than the first coupling members 6) as illustrated in FIG. 3.

For the back frames 4, the base frames 5, the first coupling members 6, and the second coupling members 7, it is desirable to use a material that is light and excellent in heat dissipation, such as aluminum (Al) alone or an alloy containing aluminum.

Here, in the embodiment, as illustrated in FIG. 4, one back frame 4 and a pair of the base frames 5 coupled to the back frame 4 include an angle adjustment unit 20 that adjusts an angle between the pair of base frames 5. Details of the angle adjustment unit 20 will be described in the following.

Figure 5:
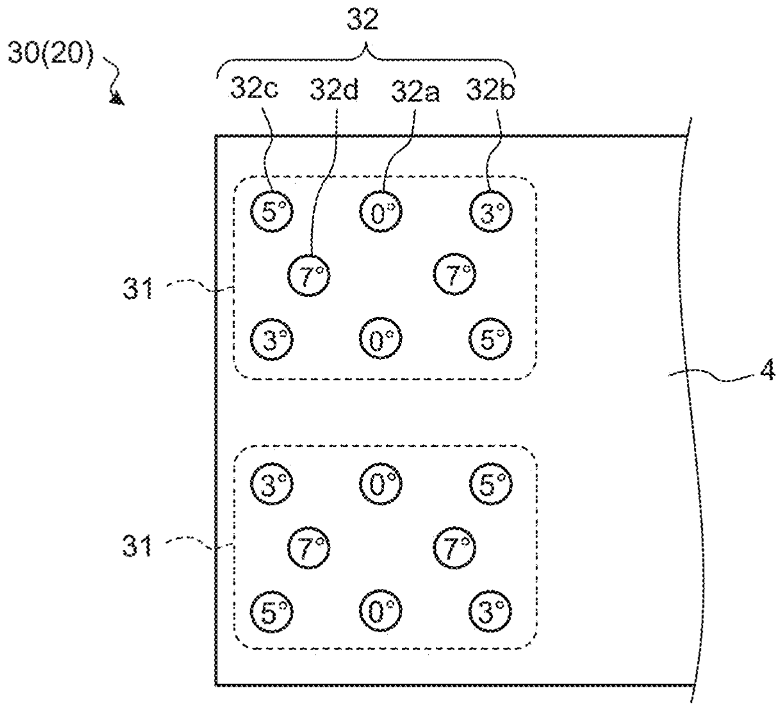
FIG. 5 is a top view illustrating an example of a configuration of an angle adjustment unit according to the embodiment of the present disclosure.

FIG. 5 is a top view illustrating an example of a configuration of the angle adjustment unit 20 according to the embodiment of the present disclosure, and is a view illustrating a first angle adjustment unit 30, which is provided in each of the back frames 4, in the angle adjustment unit 20.

The first angle adjustment unit 30 includes a pair of screw hole groups 31. The pair of screw hole groups 31 corresponds to through hole groups 41 (see FIG. 6) of second angle adjustment units 40 (see FIG. 6) respectively provided in the pair of base frames 5 (see FIG. 4). A plurality of screw holes 32 is formed in the screw hole groups 31.

In addition, the screw holes 32 of different types are formed in the screw hole groups 31 for each angle (also referred to as an "attachment angle" in the present disclosure) between the pair of base frames 5 adjusted by the angle adjustment unit 20. For example, in the angle adjustment unit 20 of the present disclosure, four types of attachment angles of 0(°), 3(°), 5(°), and 7(°) are set in advance.

In this case, each of the screw hole groups 31 includes a screw hole 32*a* corresponding to the attachment angle of 0(°), a screw hole 32*b* corresponding to the attachment angle of 3(°), a screw hole 32*c* corresponding to the attachment angle of 5(°), and a screw hole 32*d* corresponding to the attachment angle of 7(°). In addition, the plurality of (two in the drawing) screw holes 32*a* to 32*d* is formed in each of the screw hole groups 31.

Figure 6:
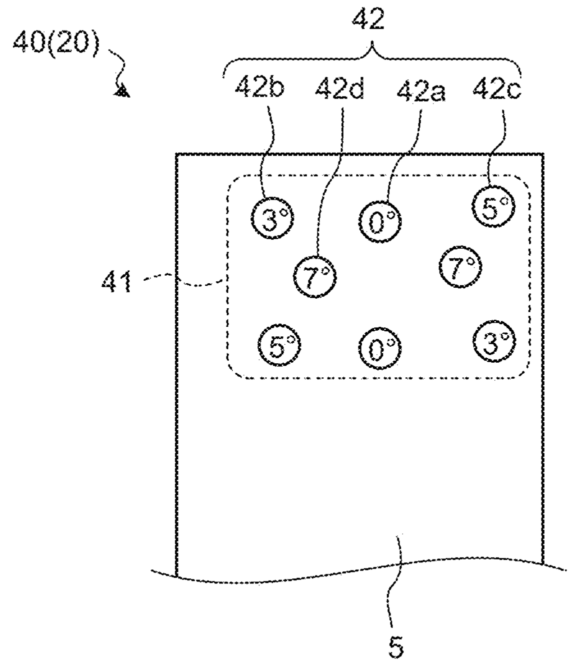
FIG. 6 is a top view illustrating the example of the configuration of the angle adjustment unit according to the embodiment of the present disclosure.

FIG. 6 is a top view illustrating an example of the configuration of the angle adjustment unit 20 according to the embodiment of the present disclosure, and is a view illustrating the second angle adjustment unit 40 provided in the base frame 5 in the angle adjustment unit 20.

The second angle adjustment unit 40 includes the through hole group 41. A plurality of through holes 42 is formed in the through hole group 41. In addition, the through holes 42 of different types are formed in the through hole group 41 for each of the attachment angles adjusted by the angle adjustment unit 20.

For example, the through hole group 41 of the present disclosure includes a through hole 42*a* corresponding to the attachment angle of 0(°), a through hole 42*b* corresponding to the attachment angle of 3(°), a through hole 42*c* corresponding to the attachment angle of 5(°), and a through hole 42*d* corresponding to the attachment angle of 7(°). In addition, the plurality of (two in the drawing) through holes 42*a* to 42*d* is formed in the through hole group 41.

Figure 7:
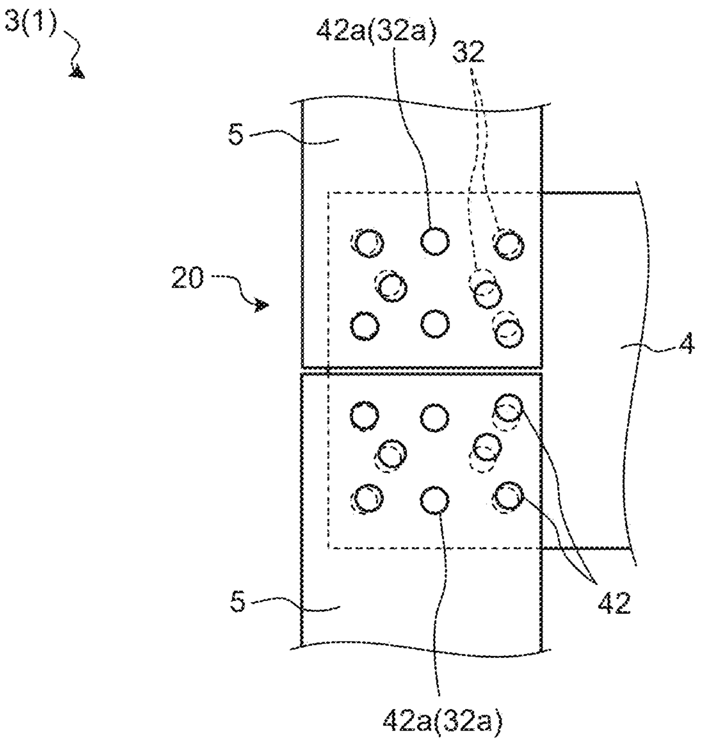
FIG. 7 is a top view illustrating an example of the configuration of the angle adjustment unit of a case where an attachment angle is 0(°).

FIG. 7 is a top view illustrating an example of the configuration of the angle adjustment unit 20 of a case where the attachment angle is 0(°). As illustrated in FIG. 7, in the present disclosure, for example, the base frames 5 are attached to the back frames 4 in such a manner that the second angle adjustment units 40 (see FIG. 6) of the base frames 5 cover the first angle adjustment units 30 (see FIG. 5) of the back frames 4.

Then, during this attachment work, the base frames 5 are attached to the back frames 4 in such a manner that the screw holes 32 and the through holes 42 corresponding to the desired attachment angle overlap each other, and bolts (not illustrated) are screwed into the screw holes 32 through the through holes 42.

For example, in the example of FIG. 7, since the desired attachment angle is 0(°), the base frames 5 are attached to the back frames 4 and the bolts are further attached in such a manner that the screw holes 32*a* and the through holes 42*a* corresponding to the attachment angle 0(°) overlap each other.

In such a manner, by attaching the pair of base frames 5 at the attachment angle 0(°), it is possible to set an angle between the back frames 4 coupled to each other via the base frames 5 to 0(°).

Figure 8:
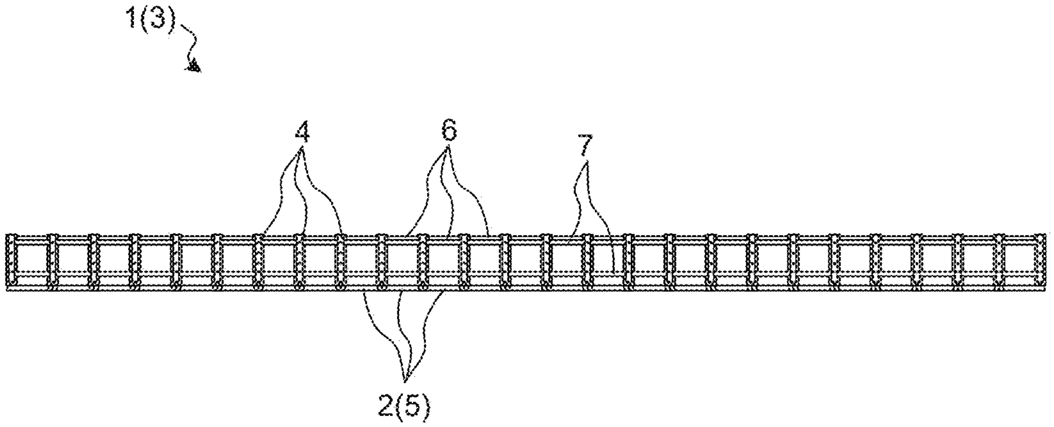
FIG. 8 is a top view illustrating an example of the configurations of the video wall and the frame system of a case where the attachment angle is 0(°).

Thus, according to the embodiment, as illustrated in FIG. 8, since all the back frames 4 are arranged in parallel, the video wall 1 in which the display screen including the plurality of display units 2 is flat can be configured. FIG. 8 is a top view illustrating an example of the configurations of the video wall 1 and the frame system 3 of a case where the attachment angle is 0(°).

Figure 9:
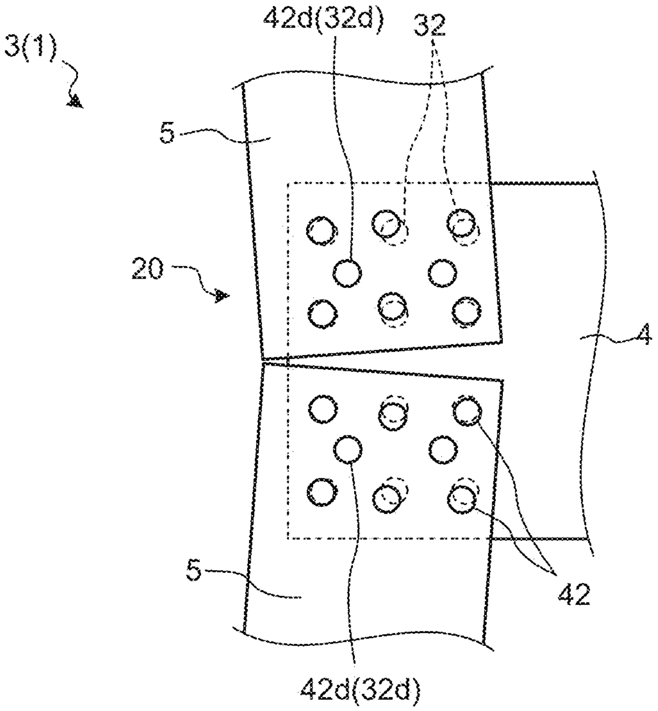
FIG. 9 is a top view illustrating an example of the configuration of the angle adjustment unit of a case where the attachment angle is 7(°).

FIG. 9 is a top view illustrating an example of the configuration of the angle adjustment unit 20 of a case where the attachment angle is 7(°). In the example of FIG. 9, since the desired attachment angle is 7(°), the base frames 5 are attached to the back frames 4 and the bolts (not illustrated) are further attached in such a manner that the screw holes 32*d* and the through holes 42*d* corresponding to the attachment angle 7(°) overlap each other.

In such a manner, by attaching the pair of base frames 5 to each other at the attachment angle 7(°), it is possible to set the angle between the back frames 4 coupled to each other via the base frames 5 to 7(°).

Figure 10:
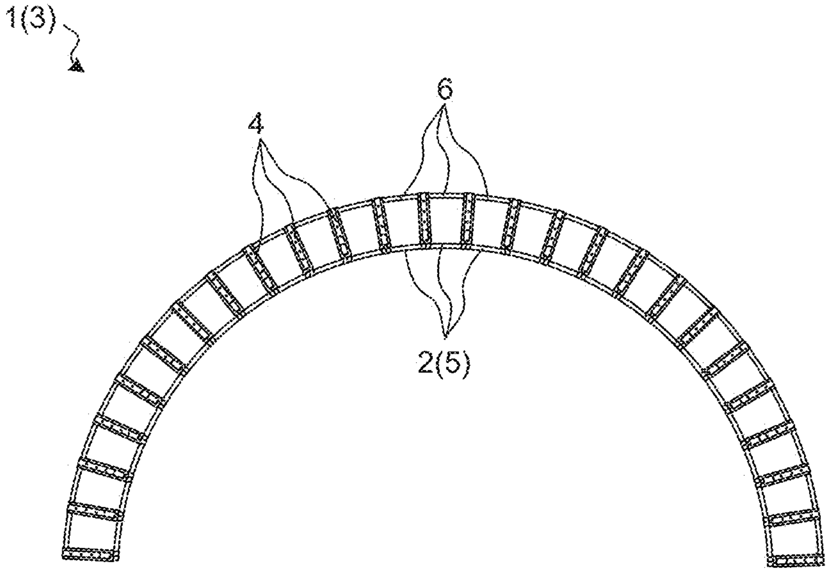
FIG. 10 is a top view illustrating an example of the configurations of the video wall and the frame system of a case where the attachment angle is 7(°).

Thus, according to the embodiment, as illustrated in FIG. 10, since the parallel back frames 4 are arranged in a manner of being inclined by 7(°), it is possible to configure the video wall 1 in which the display screen including the plurality of display units 2 is an arc having a small radius of curvature. FIG. 10 is a top view illustrating an example of the configurations of the video wall 1 and the frame system 3 of a case where the attachment angle is 7(°).

Note that although not illustrated, when the base frames 5 are attached to the back frames 4 in such a manner that the screw holes 32*b* (see FIG. 5) and the through holes 42*b* (see FIG. 6) corresponding to the attachment angle 3(°) overlap with each other, an angle between the pair of base frames 5 becomes 3(°).

In such a manner, by attaching the pair of base frames 5 to each other at the attachment angle 3(°), it is possible to set the angle between the back frames 4 coupled to each other via the base frames 5 to 3(°).

Figure 11:
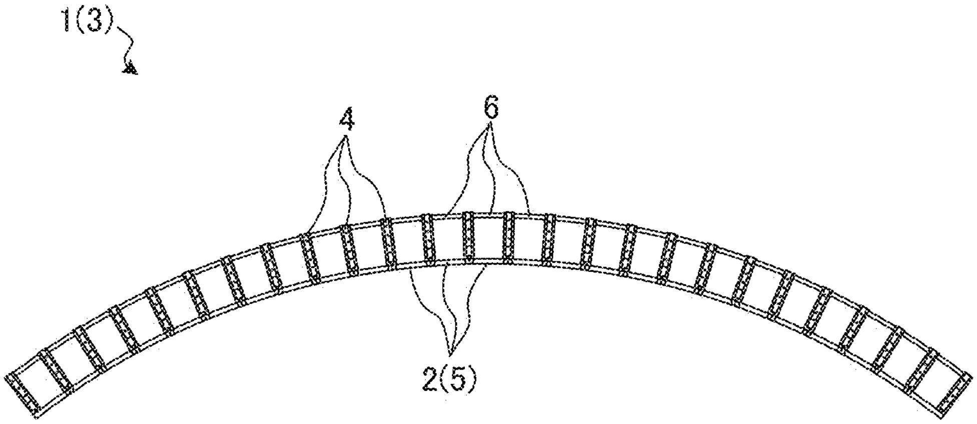
FIG. 11 is a top view illustrating an example of the configurations of the video wall and the frame system of a case where the attachment angle is 3(°).

Thus, according to the embodiment, as illustrated in FIG. 11, since the parallel back frames 4 are arranged in a manner of being inclined by 3(°), it is possible to configure the video wall 1 in which the display screen including the plurality of display units 2 is an arc having a large radius of curvature. FIG. 11 is a top view illustrating an example of the configurations of the video wall 1 and the frame system 3 of a case where the attachment angle is 3(°).

In addition, although not illustrated, when the base frames 5 are attached to the back frames 4 in such a manner that the screw holes 32*c* (see FIG. 5) and the through holes 42*c* (see FIG. 6) corresponding to the attachment angle 5(°) overlap with each other, the angle between the pair of base frames 5 becomes 5(°).

In such a manner, by attaching the pair of base frames 5 to each other at the attachment angle 5(°), the angle between the back frames 4 coupled to each other via the base frames 5 can be set to 5(°).

Figure 12:
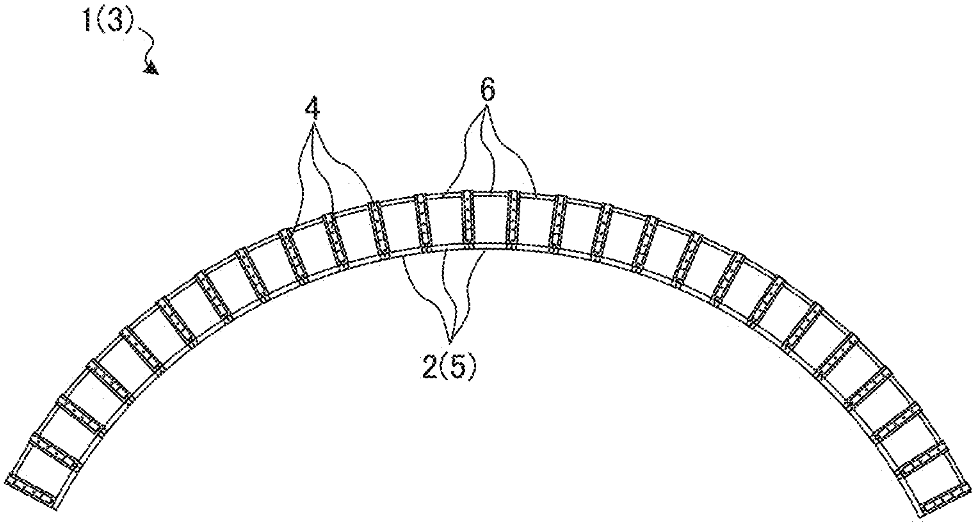
FIG. 12 is a top view illustrating an example of the configurations of the video wall and the frame system of a case where the attachment angle is 5(°).

Thus, according to the embodiment, as illustrated in FIG. 12, since the parallel back frames 4 are arranged in a manner of being inclined by 5(°), it is possible to configure the video wall 1 in which the display screen including the plurality of display units 2 is an arc having a relatively small radius of curvature. FIG. 12 is a top view illustrating an example of the configurations of the video wall 1 and the frame system 3 of a case where the attachment angle is 5(°).

As described above, in the embodiment, by adjusting the attachment angle between the pair of base frames 5 to a desired angle by the angle adjustment unit 20, the angle between the adjacent back frames 4 can be easily adjusted to the desired angle.

Thus, according to the embodiment, since the angle between the display units 2 adjacent in a lateral direction can be easily adjusted to a desired angle, it is possible to easily form a large screen having a desired curvature in the video wall 1.

In the embodiment, the angle adjustment unit 20 may include the plurality of through holes 42 formed in the base frames 5 and respectively corresponding to the plurality of attachment angles, and the plurality of screw holes 32 formed in the back frames 4 and respectively corresponding to the plurality of attachment angles.

Thus, the attachment angle between the pair of base frames 5 can be easily adjusted to a desired angle by the angle adjustment unit 20.

Note that in the embodiment, a preset attachment angle may be marked in the vicinity of the through holes 42 in the base frames 5 and in the vicinity of the screw holes 32 in the back frames 4. Accordingly, it is possible to prevent the base frames 5 from being attached to the back frames 4 at an attachment angle different from the desired angle.

In addition, the angle adjustment unit 20 may be arranged at the bottom portion on the side of holding the display units 2 in each of the back frames 4 in the embodiment. Thus, the angle adjustment unit 20 can be arranged close to the display units 2, whereby the angle between the adjacent display units 2 can be adjusted accurately.

Furthermore, since the angle adjustment unit 20 is arranged at the bottom portion on the side of holding the display units 2 in each of the back frames 4, the angle adjustment unit 20 can be prevented from interfering with the display screen formed by the plurality of display units 2.

Figure 13:
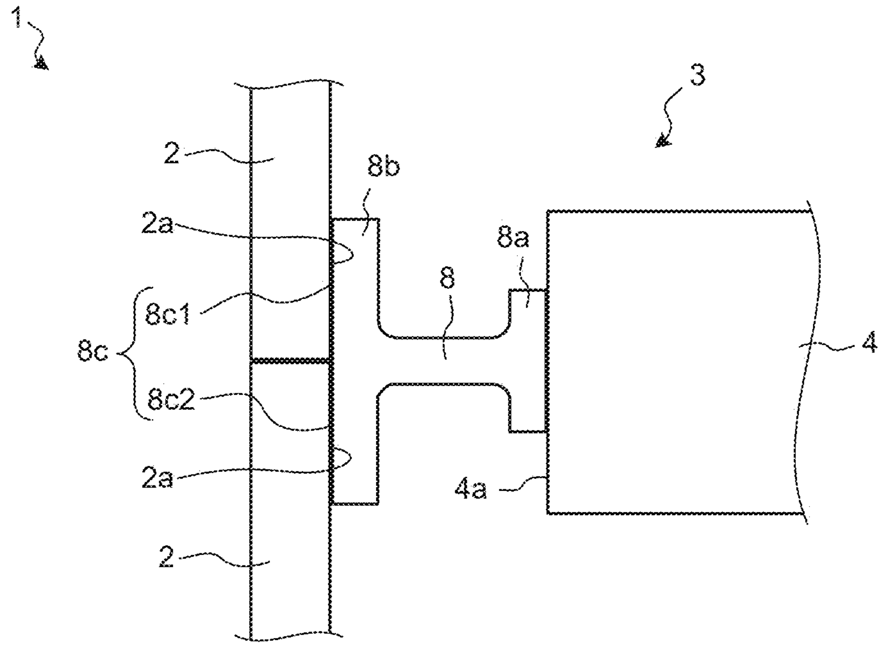
FIG. 13 is a top view illustrating an example of a configuration of an attachment member corresponding to the attachment angle 0(°).
Figure 14:
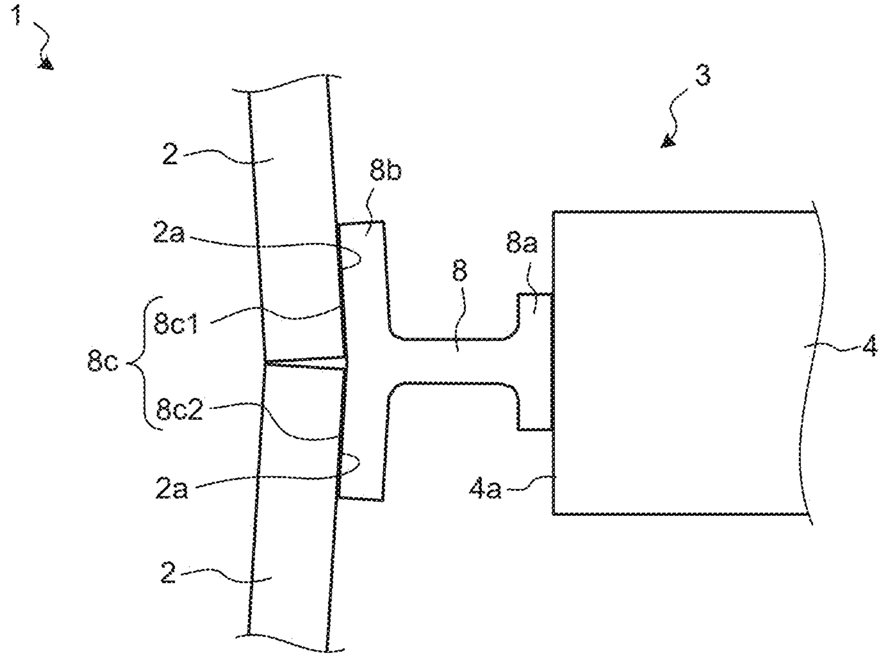
FIG. 14 is a top view illustrating an example of a configuration of an attachment member corresponding to the attachment angle 7(°).

FIG. 13 is a top view illustrating an example of the configuration of the attachment member 8 corresponding to the attachment angle 0(°), and FIG. 14 is a top view illustrating an example of the configuration of the attachment member 8 corresponding to the attachment angle 7(°).

As illustrated in FIG. 13 and FIG. 14, a dedicated attachment member 8 is used according to the desired attachment angle in the embodiment. Specifically, the attachment member 8 according to the embodiment has a dog-bone shape in a planar view, and has an attachment surface 8*c* at a distal end portion 8*b* on a side opposite to a proximal end portion 8*a* abutting on a side portion 4*a* of each of the back frames 4.

Furthermore, the attachment surface 8*c* has a first attachment surface 8*c*1 in contact with the back surface 2*a* of one of the display units 2 and a second attachment surface 8*c*2 in contact with the back surface 2*a* of the other display unit 2. Then, in the attachment member 8, an angle between the first attachment surface 8*c*1 and the second attachment surface 8*c*2 is set to be the same angle as the desired attachment angle.

For example, in the example of FIG. 13, since the attachment member 8 corresponds to the attachment angle 0(°), the angle between the first attachment surface 8*c*1 and the second attachment surface 8*c*2 is set to 0(°). In addition, in the example of FIG. 14, since the attachment member 8 corresponds to the attachment angle 7(°), the angle between the first attachment surface 8*c*1 and the second attachment surface 8*c*2 is set to 7(°).

As described above, in the embodiment, since the attachment surface 8*c* having the angle corresponding to the desired attachment angle is provided on the attachment member 8, even in a case where the display screen has a desired curvature, a contact area between the attachment member 8 and the display units 2 can be increased.

Thus, according to the embodiment, even in a case where the display screen has the desired curvature, the display units 2 can be firmly attached to the back frames 4.

In addition, as illustrated in the side view of FIG. 3 and the plan view of FIG. 13, the attachment member 8 may be capable of holding corner portions of the display units 2 in the embodiment. As a result, since the corner portions of four of the display units 2 can be simultaneously held by the one attachment member 8, the number of attachment members 8 can be reduced.

Thus, according to the embodiment, a manufacturing cost of the video wall 1 can be reduced.

In the embodiment, as illustrated in FIG. 3 and FIG. 4, the frame system 3 may include the first coupling member 6 that is arranged at the bottom portion on the side opposite to the side of holding the display unit 2 in each of the back frames 4, and that couples the adjacent back frames 4 to each other in the direction parallel to the floor F.

As a result, the adjacent back frames 4 can be more firmly coupled to each other as compared with a case where the adjacent back frames 4 are coupled to each other only by the base frame 5. Thus according to the embodiment, it is possible to control collapse of a shape of the frame system 3 due to vibration of the floor F or the like.

In addition, in the embodiment, a dedicated first coupling member 6 may be used according to the desired attachment angle. Specifically, a length of the first coupling member 6 according to the embodiment may be gradually increased as the desired attachment angle increases.

Accordingly, even in a case where the display screen has the desired curvature, the first coupling member 6 can be attached to a predetermined position (such as the bottom portion on the side opposite to the side of holding the display unit 2 in each of the back frames 4) without any problem.

Thus, according to the embodiment, it is possible to control the collapse of the shape of the frame system 3 due to the vibration of the floor For the like even in a case where the display screen has the desired curvature.

In the embodiment, the frame system 3 may further include the second coupling member 7 that is arranged at the position farther from the floor F than the first coupling member 6 and couples the adjacent back frames 4 to each other in the direction parallel to the floor F.

As a result, the adjacent back frames 4 can be more firmly coupled to each other as compared with a case where the adjacent back frames 4 are coupled to each other only by the base frame 5 and the first coupling member 6. Thus, according to the embodiment, it is possible to further control the collapse of the shape of the frame system 3 due to the vibration of the floor For the like.

In addition, as illustrated in FIG. 4, one second coupling member 7 may be arranged across three or more back frames 4 in the embodiment. Accordingly, since the three or more back frames 4 can be simultaneously held by the one second coupling member 7, the number of second coupling members 7 can be reduced.

Thus, according to the embodiment, a manufacturing cost of the video wall 1 can be reduced.

Effect

The frame system 3 according to the embodiment includes the plurality of back frames 4 and the plurality of base frames 5. The plurality of back frames 4 is arranged side by side, and can respectively hold the back surfaces 2*a* of the display units 2. The plurality of base frames 5 also couples the adjacent back frames 4 to each other in the direction parallel to the floor F. In addition, each of the back frames 4 and the pair of base frames 5 coupled to the back frame 4 include the angle adjustment unit 20 that adjusts the angle between the pair of base frames 5.

As a result, a large screen having a desired curvature can be easily formed on the video wall 1.

In addition, in the frame system 3 according to the embodiment, the plurality of back frames 4 is arranged in a state of rising vertically to the floor F.

As a result, the video wall 1 can be stably installed on the floor F.

In addition, in the frame system 3 according to the embodiment, the angle adjustment unit 20 includes the plurality of through holes 42 and the plurality of screw holes 32. The plurality of through holes 42 is formed in the base frames 5 and respectively corresponds to the plurality of angles. The plurality of screw holes 32 is formed in the back frames 4 and respectively corresponds to the plurality of angles.

Thus, the attachment angle between the pair of base frames 5 can be easily adjusted to a desired angle by the angle adjustment unit 20.

In addition, in the frame system 3 according to the embodiment, the angle adjustment unit 20 is arranged at the bottom portion on the side of holding the display unit 2 (side portion 4*a*) in each of the back frames 4.

As a result, the angle between the adjacent display units 2 can be accurately adjusted, and the angle adjustment unit 20 can be prevented from interfering with the display screen formed by the plurality of display units 2.

In addition, the frame system 3 according to the embodiment further includes the attachment member 8 that is arranged on the side portion 4*a* on the side of holding the display unit 2 in each of the back frames 4 and that is capable of directly holding the back surface 2*a* of the display unit 2.

As a result, even in a case where the display screen has the desired curvature, the display units 2 can be firmly attached to the back frames 4.

In addition, in the frame system 3 according to the embodiment, the attachment member 8 has the attachment surface 8*c* having the angle corresponding to the angle between the pair of base frames 5.

As a result, even in a case where the display screen has the desired curvature, the display units 2 can be firmly attached to the back frames 4.

Furthermore, in the frame system 3 according to the embodiment, the attachment member 8 can hold the corner portions on the back surface 2*a* of the display units 2.

As a result, the manufacturing cost of the video wall 1 can be reduced.

In addition, in the frame system 3 according to the embodiment, each of the back frames 4 includes the plurality of attachment members 8 to hold the back surfaces 2*a* of the display units 2.

As a result, the video wall 1 having a larger screen can be easily formed.

In the frame system 3 according to the embodiment, the attachment member 8 can hold the plurality of display units 2.

As a result, the manufacturing cost of the video wall 1 can be reduced.

In the frame system 3 according to the embodiment, the attachment member 8 can hold the four display units 2.

As a result, the manufacturing cost of the video wall 1 can be reduced.

The frame system 3 according to the embodiment further includes the first coupling member 6 that is arranged at the bottom portion on the side opposite to the side of holding the display unit 2 (side portion 4*a*) in each of the back frames 4 and that couples the adjacent back frames 4 to each other in the direction parallel to the floor F.

As a result, it is possible to control the collapse of the shape of the frame system 3 due to the vibration of the floor F or the like.

In addition, in the frame system 3 according to the embodiment, the first coupling member 6 has a length corresponding to the angle between the pair of base frames 5.

As a result, it is possible to control the collapse of the shape of the frame system 3 due to the vibration of the floor F or the like even in a case where the display screen has the desired curvature.

In addition, the frame system 3 according to the embodiment further includes the second coupling member 7 that is arranged at the position farther from the floor F than the first coupling member 6 and that couples the adjacent back frames 4 to each other in the direction parallel to the floor F.

As a result, it is possible to further control the collapse of the shape of the frame system 3 due to the vibration of the floor F or the like.

In addition, in the frame system 3 according to the embodiment, the second coupling member 7 is arranged across the three or more back frames 4.

As a result, the manufacturing cost of the video wall 1 can be reduced.

In addition, the display device (video wall 1) according to the embodiment includes the plurality of back frames 4, the plurality of display units 2, and the plurality of base frames 5. The plurality of back frames 4 is arranged side by side. The plurality of display units 2 is held between the adjacent back frames 4 and arranged in a matrix. The plurality of base frames 5 also couples the adjacent back frames 4 to each other in the direction parallel to the floor F. In addition, each of the back frames 4 and the pair of base frames 5 coupled to the back frame 4 include the angle adjustment unit 20 that adjusts the angle between the pair of base frames 5.

As a result, the video wall 1 having a large screen with a desired curvature can be easily realized.

Although an embodiment of the present disclosure has been described above, the technical scope of the present disclosure is not limited to the above-described embodiment as it is, and various modifications can be made within the spirit and scope of the present disclosure. In addition, components of different embodiments and modification examples may be arbitrarily combined.

For example, although an example in which four types of the attachment angles of 0(°), 3(°), 5(°), and 7(°) are set has been described in the above embodiment, the present disclosure is not limited to such an example, and various types of attachment angles can be arbitrarily set.

Furthermore, an effect described in the present description is merely an example and is not a limitation, and there may be another effect.

Note that the present technology can also have the following configurations.

(1)

A frame system comprising:

a plurality of back frames which is arranged side by side, and each of which is capable of holding a back surface of a display unit; and a plurality of base frames that couples the back frames, which are adjacent to each other, in a direction parallel to a floor, wherein each of the back frames and a pair of the base frames coupled to the back frame include an angle adjustment unit that adjusts an angle between the pair of base frames.

(2)

The frame system according to the above (1), wherein the plurality of back frames is arranged in a state of rising vertically to the floor.

(3)

The frame system according to the above (1) or (2), wherein the angle adjustment unit includes a plurality of through holes formed in the base frames and respectively corresponding to a plurality of angles, and a plurality of screw holes formed in the back frames and respectively corresponding to the plurality of angles.

(4)

The frame system according to any one of the above (1) to (3), wherein the angle adjustment unit is arranged at a bottom portion on a side of holding the display unit in each of the back frames.

(5)

The frame system according to any one of the above (1) to (4), further comprising an attachment member that is arranged in a side portion on a side of holding the display unit in each of the back frames and is capable of directly holding the back surface of the display unit.

(6)

The frame system according to the above (5), wherein the attachment member includes an attachment surface having an angle corresponding to an angle between the pair of base frames.

(7)

The frame system according to the above (5) or (6), wherein the attachment member can hold a corner portion in the back surface of the display unit.

(8)

The frame system according to any one of the above (5) to (7), wherein each of the back frames includes a plurality of the attachment members to hold the back surface of the display unit.

(9)

The frame system according to any one of the above (5) to (8), wherein the attachment member can hold a plurality of the display units.

(10)

The frame system according to the above (9), wherein the attachment member can hold four of the display units.

(11)

The frame system according to any one of the above (1) to (10), further comprising a first coupling member that is arranged at a bottom portion on a side opposite to a side of holding the display unit in each of the back frames, and couples the adjacent back frames in the direction parallel to the floor.

(12)

The frame system according to the above (11), wherein the first coupling member has a length corresponding to the angle between the pair of base frames.

(13)

The frame system according to the above (11) or (12), further comprising a second coupling member that is arranged at a position farther from the floor than the first coupling member and couples the adjacent back frames in the direction parallel to the floor.

(14)

The frame system according to the above (13), wherein the second coupling member is arranged across three or more of the back frames.

(15)

A display device comprising:

a plurality of back frames arranged side by side;

a plurality of display units each of which is held between the back frames adjacent to each other, and which is arranged in a matrix; and a plurality of base frames that couples the adjacent back frames to each other in a direction parallel to a floor, wherein each of the back frames and a pair of the base frames coupled to the back frame include an angle adjustment unit that adjusts an angle between the pair of base frames.

(16)

The display device according to the above (15), wherein the plurality of back frames is arranged in a state of rising vertically to a floor.

(17)

The display device according to the above (15) or (16), wherein the angle adjustment unit includes a plurality of through holes formed in the base frames and respectively corresponding to a plurality of angles, and a plurality of screw holes formed in the back frames and respectively corresponding to the plurality of angles.

(18)

The display device according to any one of the above (15) to (17), wherein the angle adjustment unit is arranged at a bottom portion on a side of holding the display units in each of the back frames.

(19)

The display device according to any one of the above (15) to (18), further comprising an attachment member that is arranged in a side portion on a side of holding the display units in each of the back frames and is capable of directly holding a back surface of each of the display units.

(20)

The display device according to the above (19), wherein the attachment member includes an attachment surface having an angle corresponding to an angle between the pair of base frames.

(21)

The display device according to the above (19) or (20), wherein the attachment member can hold a corner portion in the back surface of the display units.

(22)

The display device according to any one of the above (19) to (21), wherein each of the back frames includes a plurality of the attachment members to hold the back surface of the display units.

(23)

The display device according to any one of the above (19) to (22), wherein the attachment member can hold the plurality of display units.

(24)

The display device according to the above (23), wherein the attachment member can hold four of the display units.

(25)

The display device according to any one of the above (15) to (24), further comprising a first coupling member that is arranged at a bottom portion on a side opposite to a side of holding the display units in each of the back frames, and couples the adjacent back frames in the direction parallel to the floor.

(26)

The display device according to the above (25), wherein the first coupling member has a length corresponding to the angle between the pair of base frames.

(27)

The display device according to the above (25) or (26), further comprising a second coupling member that is arranged at a position farther from the floor than the first coupling member and couples the adjacent back frames in the direction parallel to the floor.

(28)

The display device according to the above (27), wherein the second coupling member is arranged across three or more of the back frames.

REFERENCE SIGNS LIST

1 VIDEO WALL (EXAMPLE OF DISPLAY DEVICE)
2 DISPLAY UNIT
2*a* BACK SURFACE
3 FRAME SYSTEM
4 BACK FRAME
5 BASE FRAME
6 FIRST COUPLING MEMBER
7 SECOND COUPLING MEMBER
8 ATTACHMENT MEMBER
8*c* ATTACHMENT SURFACE
20 ANGLE ADJUSTMENT UNIT
30 FIRST ANGLE ADJUSTMENT UNIT
31 SCREW HOLE GROUP
32, 32*a* to 32*d* SCREW HOLE
40 SECOND ANGLE ADJUSTMENT UNIT
41 THROUGH HOLE GROUP
42, 42*a* to 42*d* THROUGH HOLE
F FLOOR

The invention claimed is:

1. A frame system, comprising:

a plurality of back frames, wherein the plurality of back frames is arranged side by side, and each back frame of the plurality of back frames is capable to hold a back surface of a display unit; and a plurality of base frames configured to couple the plurality of back frames, wherein each base frame of the plurality of base frames couples two back frames of the plurality of back frames that are adjacent, in a direction parallel to a floor, wherein each back frame of the plurality of back frames and a pair of base frames of the plurality of base frames coupled to a respective back frame of the plurality of back frames include an angle adjustment unit, and the angle adjustment unit is configured to adjust an angle between the pair of base frames.

2. The frame system according to claim 1, wherein the plurality of back frames is in a state that rises vertically to the floor.

3. The frame system according to claim 1, wherein the angle adjustment unit includes:

a plurality of through holes in the plurality of base frames, wherein each through hole of the plurality of through holes respectively corresponds to a plurality of angles; and a plurality of screw holes in the plurality of back frames, wherein each screw hole of the plurality of screw holes respectively corresponds to the plurality of angles.

4. The frame system according to claim 1, wherein the angle adjustment unit is at a bottom portion on a side that holds the display unit in each back frame of the plurality of back frames.

5. The frame system according to claim 1, further comprising an attachment member in a side portion on a side that holds the display unit in each back frame of the plurality of back frames, wherein the side is capable to directly hold the back surface of the display unit.

6. The frame system according to claim 5, wherein the attachment member includes an attachment surface, and the attachment surface has an angle corresponding to the angle between the pair of base frames.

7. The frame system according to claim 5, wherein the attachment member is configured to hold a corner portion in the back surface of the display unit.

8. The frame system according to claim 5, wherein each back frame of the plurality of back frames includes a plurality of attachment members to hold the back surface of the display unit, and the plurality of attachment members includes the attachment member.

9. The frame system according to claim 5, wherein the attachment member is configured to hold a plurality of display units, and the plurality of display units includes the display unit.

10. The frame system according to claim 9, wherein the attachment member is configured to hold four display units of the plurality of display units.

11. The frame system according to claim 1, further comprising a first coupling member at a bottom portion on a first side of each back frame of the plurality of back frames, wherein the first side is opposite to a second side of each back frame of the plurality of back frames, the second side holds the display unit in each back frame of the plurality of back frames, and the first coupling member is configured to couple the two back frames in the direction parallel to the floor.

12. The frame system according to claim 11, wherein the first coupling member has a length corresponding to the angle between the pair of base frames.

13. The frame system according to claim 11, further comprising a second coupling member at a second position, wherein the second position is farther from the floor than a first position of the first coupling member, and the second coupling member is configured to couple the two back frames in the direction parallel to the floor.

14. The frame system according to claim 13, wherein the second coupling member is across three or more back frames of the plurality of back frames.

15. A display device, comprising:

a plurality of back frames side by side;

a plurality of display units, wherein each display unit of the plurality of display units is between two back frames of the plurality of back frames that are adjacent to each other, and the plurality of display units is in a matrix; and a plurality of base frames configured to couple the plurality of back frames, wherein each base frame of the plurality of base frames couples the two back frames in a direction parallel to a floor, wherein each back frame of the plurality of back frames and a pair of base frames of the plurality of base frames coupled to a respective back frame of the plurality of back frames include an angle adjustment unit, and the angle adjustment unit is configured to adjust an angle between the pair of base frames.

16. The display device according to claim 15, wherein the angle adjustment unit includes:

a plurality of through holes in the plurality of base frames, wherein each through hole of the plurality of through holes respectively corresponds to a plurality of angles; and a plurality of screw holes in the plurality of back frames, wherein each screw hole of the plurality of screw holes respectively corresponds to the plurality of angles.

17. The display device according to claim 15, wherein the angle adjustment unit is at a bottom portion on a side that holds a display unit of the plurality of display units in each back frame of the plurality of back frames.

18. The display device according to claim 15, further comprising an attachment member in a side portion on a side that holds the display unit of the plurality of display units in each back frame of the plurality of back frames, wherein the side is capable to directly hold a back surface of each display unit of the plurality of display units.

19. The display device according to claim 18, wherein the attachment member is configured to hold a corner portion in the back surface of each display unit of the plurality of display units.

20. The display device according to claim 18, wherein the attachment member is configured to hold the plurality of display units.

* * * * *